(12) United States Patent
Tean et al.

(10) Patent No.: US 11,069,600 B2
(45) Date of Patent: Jul. 20, 2021

(54) SEMICONDUCTOR PACKAGE WITH SPACE EFFICIENT LEAD AND DIE PAD DESIGN

(71) Applicant: Infineon Technologies AG, Neubiberg (DE)

(72) Inventors: Ke Yan Tean, Melaka (MY); Thomas Bemmerl, Schwandorf (DE); Thai Kee Gan, Melaka (MY); Azlina Kassim, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 75 days.

(21) Appl. No.: 16/422,163

(22) Filed: May 24, 2019

(65) Prior Publication Data

US 2020/0373228 A1    Nov. 26, 2020

(51) Int. Cl.
*H01L 23/495* (2006.01)
*H01L 21/48* (2006.01)
(Continued)

(52) U.S. Cl.
CPC .... *H01L 23/49513* (2013.01); *H01L 21/4821* (2013.01); *H01L 23/3107* (2013.01);
(Continued)

(58) Field of Classification Search
CPC .......... H01L 23/49555; H01L 23/4824; H01L 23/49503; H01L 23/49153; H01L 23/49537; H01L 2924/15162; H01L 2924/1515; H01L 24/71; H01L 24/72; H01L 21/4896; H01L 2224/40106; H01L 2224/40108
See application file for complete search history.

(56) References Cited

U.S. PATENT DOCUMENTS 5,012,323 A    4/1991 Farnworth
6,201,297 B1 *  3/2001 Masuda .............. H01L 23/4951
                                                                257/690
(Continued)

FOREIGN PATENT DOCUMENTS

DE    19725625 A1    1/1998

OTHER PUBLICATIONS

Hong, Chii Shang, et al., "Semiconductor Package with Multi-Level Conductive Clip for Top Side Cooling", U.S. Appl. No. 16/402,486, filed May 3, 2019, 1-37.

*Primary Examiner* — Daniel Luke
(74) *Attorney, Agent, or Firm* — Murphy, Bilak & Homiller, PLLC

(57) ABSTRACT

A semiconductor package includes a die pad having a die attach surface, a rear surface opposite the die attach surface, and an outer edge side extending between the die attach surface and the rear surface, the outer edge side having a step-shaped profile, wherein an upper section of the die pad laterally overhangs past a lower section of the die pad, a semiconductor die mounted on the die attach surface and having a first electrical terminal on an upper surface of the semiconductor die, and a first conductive clip that directly electrically contacts the first electrical terminal and wraps around the outer edge side of the die pad such that a section of the first conductive clip is at least partially within an area that is directly below the upper section of the die pad and directly laterally adjacent to the lower section.

16 Claims, 8 Drawing Sheets

(51) Int. Cl.
*H01L 23/31* (2006.01)
*H01L 23/00* (2006.01)

(52) U.S. Cl.
CPC .. *H01L 23/49537* (2013.01); *H01L 23/49555* (2013.01); *H01L 23/49562* (2013.01); *H01L 23/49568* (2013.01); *H01L 24/37* (2013.01); *H01L 24/38* (2013.01); *H01L 24/40* (2013.01); *H01L 2224/37013* (2013.01); *H01L 2224/40106* (2013.01); *H01L 2224/40108* (2013.01)

(56) References Cited

U.S. PATENT DOCUMENTS

| | | | |
|---|---|---|---|
| 7,057,273 B2 | 6/2006 | Weibing et al. | |
| 7,307,347 B2 | 12/2007 | Yagi | |
| 9,337,129 B2 * | 5/2016 | Yasunaga | H01L 23/49555 |
| 9,576,932 B2 | 2/2017 | Williams et al. | |
| 9,870,985 B1 * | 1/2018 | Mangrum | H01L 24/69 |
| 10,037,935 B1 * | 7/2018 | Pang | H01L 21/4825 |
| 10,163,762 B2 * | 12/2018 | Ding | H01L 21/52 |
| 10,366,943 B2 * | 7/2019 | Kim | H01L 23/49575 |
| 2005/0127532 A1 | 6/2005 | Zhang et al. | |
| 2008/0135991 A1 | 6/2008 | Harnden et al. | |
| 2013/0023089 A1 * | 1/2013 | Autry | H01L 23/49513 438/122 |
| 2015/0303132 A1 | 10/2015 | Michael et al. | |
| 2016/0133549 A1 * | 5/2016 | Takada | H01L 23/3114 257/669 |
| 2019/0326204 A1 * | 10/2019 | Miura | H01L 23/49503 |
| 2020/0273810 A1 * | 8/2020 | Saklang | H01L 23/49555 |

* cited by examiner

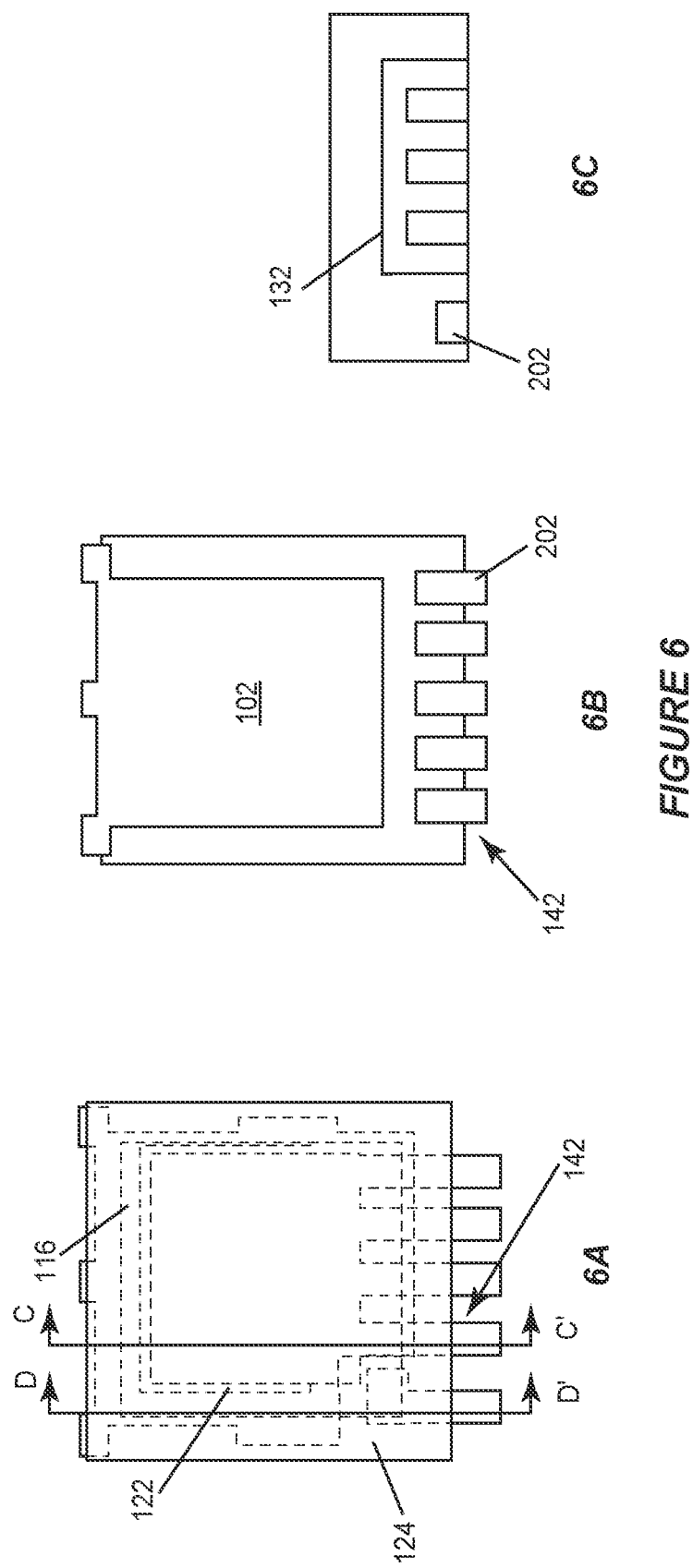

6D

6E

US 11,069,600 B2

SEMICONDUCTOR PACKAGE WITH SPACE EFFICIENT LEAD AND DIE PAD DESIGN

TECHNICAL FIELD

Embodiments of this invention generally relate to semiconductor packages and more particularly relate to interconnect configurations for semiconductor packages.

BACKGROUND

Semiconductor packages are designed to provide connective compatibility between a semiconductor die and an external apparatus, such as a printed circuit board (PCB), and to protect a semiconductor die from potentially damaging environmental conditions, such as extreme temperatures, moisture, dust particles, etc. A variety of different semiconductor package types exist to meet different application requirements. Generally speaking, semiconductor package types are differentiated based on the configuration of the package leads and/or encapsulating body. Examples of different semiconductor package types include so-called through-hole packages such as dual in-line packages (DIPs), surface mount packages such as column grid array (CGA) packages, flat packages such as very thin quad flat no-lead (VQFN) packages, etc.

One prevalent design goal in semiconductor packaging is to maximize the package size to chip ratio, which is a ratio of the lateral footprint of the encapsulant body to the lateral footprint of the semiconductor die. Maximizing this ratio can provide important performance benefits. For example, in power switching applications wherein the semiconductor die is designed to block substantially large voltages, e.g., 200 volts or more, it is desirable make the semiconductor die as large as possible to reduce the on-resistance (e.g., $R_{DSON}$). A greater package size to chip ratio accommodates larger semiconductor dies for a given package footprint.

A variety of design considerations place upper limits on the feasible package size to chip ratio. For example, so-called lead frame style packages that include a die paddle and plurality of leads limit how closely the semiconductor die can be provided to the edge of the mold compound body. Generally speaking, a package size to chip ratio of greater than 0.5 is difficult to achieve.

SUMMARY

A semiconductor package is disclosed. According to an embodiment, the semiconductor package comprises a die pad comprising a die attach surface, a rear surface opposite the die attach surface, and an outer edge side extending between the die attach surface and the rear surface, the outer edge side having a step-shaped profile, wherein an upper section of the die pad laterally overhangs past a lower section of the die pad, a semiconductor die mounted on the die attach surface and comprising a first electrical terminal on an upper surface of the semiconductor die that faces away from the die attach surface, and a first conductive clip that directly electrically contacts the first electrical terminal and wraps around the outer edge side of the die pad such that a section of the first conductive clip is at least partially within an area that is directly below the upper section of the die pad and directly laterally adjacent to the lower section.

Separately or in combination, the semiconductor package includes an electrically insulating encapsulant that encapsulates the semiconductor die, wherein the encapsulant comprises a top surface extending over the semiconductor die, a bottom surface opposite from the top surface, and wherein a lowermost surface of the first conductive clip is at or above a plane of the bottom surface of the encapsulant.

Separately or in combination, the lowermost surface of the first conductive clip is a contact surface that extends between an angled bend in the first conductive clip and the outer end of the first conductive clip, wherein the contact surface and the rear surface of the die pad are substantially coplanar with one another, and wherein the contact surface and the bottom surface of the die pad are exposed from the encapsulant.

Separately or in combination, the bottom surface of the encapsulant is substantially coplanar with the contact surface and the bottom surface of the die pad.

Separately or in combination, the semiconductor die is mounted on the die pad such that the semiconductor die laterally overhangs past the lower section of the die pad, and wherein the outer end of the first conductive clip is disposed directly below the semiconductor die.

Separately or in combination, the semiconductor package comprises an intermediary layer disposed between a rear surface of the semiconductor die and the die attach surface, wherein the intermediary layer laterally overhangs past the lower section of the die pad, and wherein the outer end of the first conductive clip is disposed directly below the intermediary layer.

Separately or in combination, the semiconductor package further comprises an electrically conductive lead that is spaced apart from the die pad, wherein the semiconductor die further comprises second and third electrical terminals disposed on a lower surface of the semiconductor die that is opposite from the upper surface of the semiconductor die, wherein the second electrical terminal directly electrically contacts the die attach surface, and wherein the third electrical terminal directly electrically contacts an upper surface of the lead.

Separately or in combination, the semiconductor die further comprises a second electrical terminal disposed at the upper surface of the semiconductor die, and wherein the semiconductor package further comprises a second conductive clip that directly electrically contacts the second electrical terminal and wraps around the outer edge side of the die pad such that an outer end of the second conductive clip is at least partially within the area that is directly below the upper section of the die pad and directly laterally adjacent to the lower section.

Separately or in combination, the first conductive clip comprises a central pad and an elongated finger, wherein the central pad is disposed directly over the first electrical terminal, wherein the elongated finger is narrower than the central pad, wherein the elongated finger connects with the central pad and protrudes out of the encapsulant, and wherein a portion of the elongated finger that is exposed from the encapsulant wraps around the outer edge side of the die pad and extends to the outer end of the first conductive clip.

Separately or in combination, the encapsulant completely covers the central pad.

Separately or in combination, the central pad extends to the top surface of the encapsulant and comprises an upper surface that is exposed from the encapsulant.

Separately or in combination, a thickness of the central pad is greater than a thickness of the elongated finger, the thickness of the central pad being measured between the upper surface of the central pad and a lower surface of the central pad that faces the first electrical terminal, the thickness of the elongated finger being measured between opposite facing upper and lower surfaces that of the elongated finger that connect with the central pad.

Separately or in combination, the first conductive clip comprises a plurality of the elongated fingers, wherein each of the elongated fingers are spaced apart from one another and intersect the same side of the central pad.

A method of packaging a semiconductor device is disclosed. According to an embodiment, the method comprises providing a die pad comprising a die attach surface, a rear surface opposite the die attach surface, and an outer edge side extending between the die attach surface and the rear surface, the outer edge side having a step-shaped profile wherein an upper section of the die pad laterally overhangs past a lower section of the die pad, mounting a semiconductor die on the die attach surface such that a first electrical terminal on an upper surface of the semiconductor die faces away from the die attach surface, and providing a first conductive clip that directly electrically contacts the first electrical terminal and wraps around the outer edge side of the die pad such that an outer end of the first conductive clip is at least partially within an area that is directly below the upper section of the die pad and directly laterally adjacent to the lower section.

Separately or in combination, the method further comprises forming an electrically insulating encapsulant that encapsulates the semiconductor die, wherein the encapsulant is formed to comprise a top surface extending over the semiconductor die, a bottom surface opposite from the top surface, and wherein a lowermost surface of the first conductive clip is at or above a plane of the bottom surface of the encapsulant.

Separately or in combination, providing the first conductive clip comprises providing a planar strip of conductive metal that electrically contacts the first terminal, forming the encapsulant after providing the planar strip of conductive metal such that an exposed portion of the planar strip protrudes out of the encapsulant, and bending the exposed portion of the planar strip such that the exposed portion wraps around the outer edge side of the die pad such that an outer end of the first conductive clip is at least partially within the area that is directly below the upper section of the die pad and directly laterally adjacent to the lower section.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A, 1B, 1C and 1D, depicts a semiconductor package, according to an embodiment. FIG. 1A is a plan view of a top side of the semiconductor package with the encapsulant material schematically depicted as translucent. FIG. 1B is a plan view of a bottom side of the semiconductor package. FIG. 1C is a cross-sectional view of the semiconductor package along the cross-sectional plane A-A' shown in FIG. 1A. FIG. 1D is a cross-sectional view of the semiconductor package along the cross-sectional plane B-B' shown in FIG. 1A.

FIGS. 6A, 6B, 6C, 6D and 6E depicts a semiconductor package, according to another embodiment. FIG. 6A is a plan view of a top side of the semiconductor package with the encapsulant material schematically depicted as translucent. FIG. 6B is a plan view of a bottom side of the semiconductor package. FIG. 6C is a side view of the semiconductor package. FIG. 6D is a cross-sectional view of the semiconductor package along the cross-sectional plane C-C' shown in FIG. 6A. FIG. 6E is a cross-sectional view of the semiconductor package along the cross-sectional plane D-D' shown in FIG. 6A.

DETAILED DESCRIPTION

A semiconductor package according to embodiments described herein includes a die pad and clip configuration that results in an advantageously high package size to chip ratio. The semiconductor package includes a dual gauge die pad wherein an upper section of the die pad laterally overhangs past a lower section of the die pad. Hence, the edge side of the die pad is step-shaped and has a groove extending from the rear surface of the die pad. The semiconductor package includes a conductive clip that forms a direct electrical connection with the electrical terminal of a semiconductor die that is mounted on the die pad. The conductive clip wraps around the die pad such that an end portion of the conductive clip laterally extends into the groove of the die pad. A lower surface of the conductive clip provides a point of external electrical contact to the semiconductor die. By using the groove region of the die pad to accommodate the end of the conductive clip, space-efficiency is improved. The die pad and/or the features mounted thereon can be disposed very close to the edge side of the encapsulant material, as the conductive clip eliminates the need for a separate leads that are laterally spaced apart from the die pad. This enables a package size to chip ratio greater than 0.5, including ratios of, e.g., higher than 0.6, 0.7, 0.8, etc. Moreover, the wrap around configuration of the conductive clip underneath the die pad minimizes the lateral footprint of the package.

Figure 1:
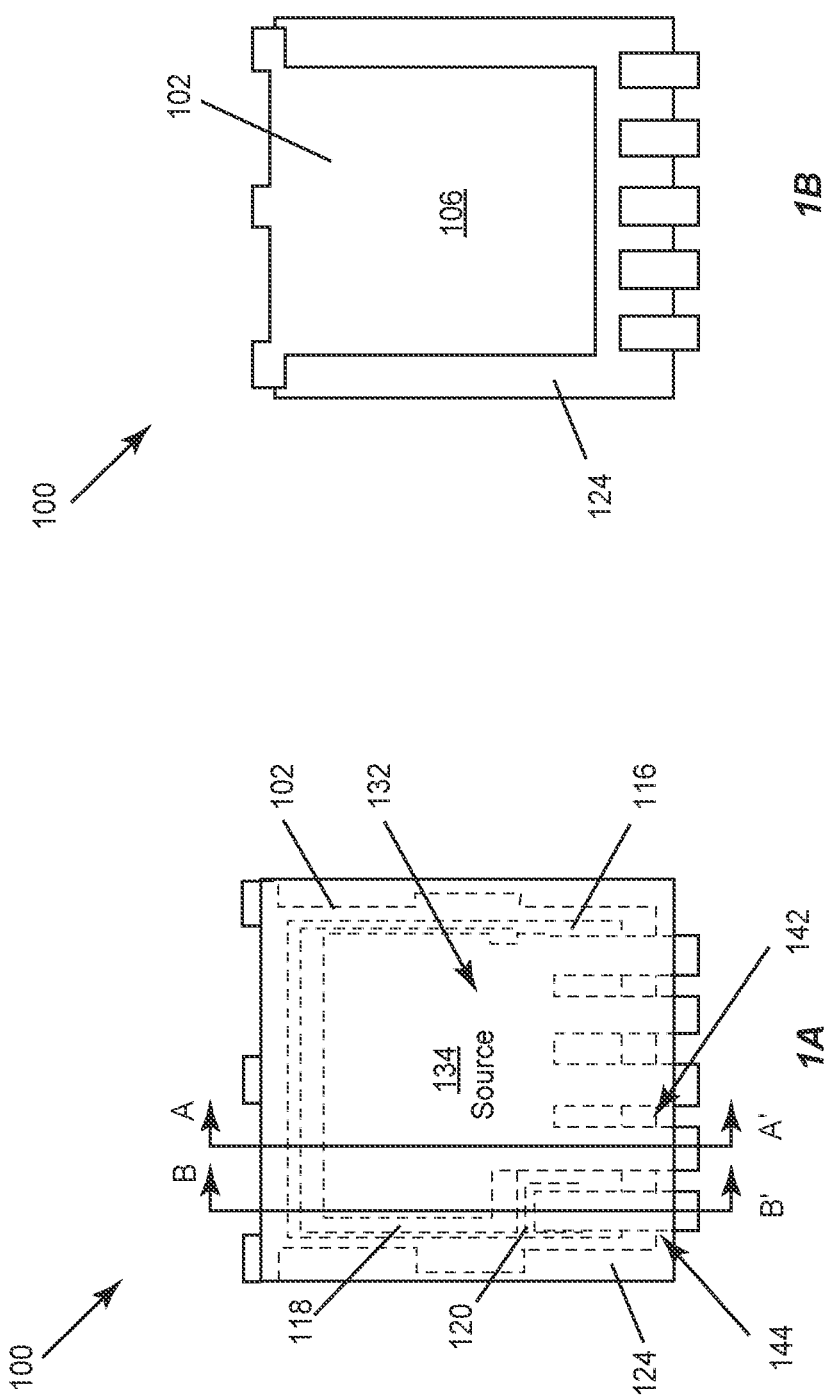
FIG. 1, which includes
Figure 1:
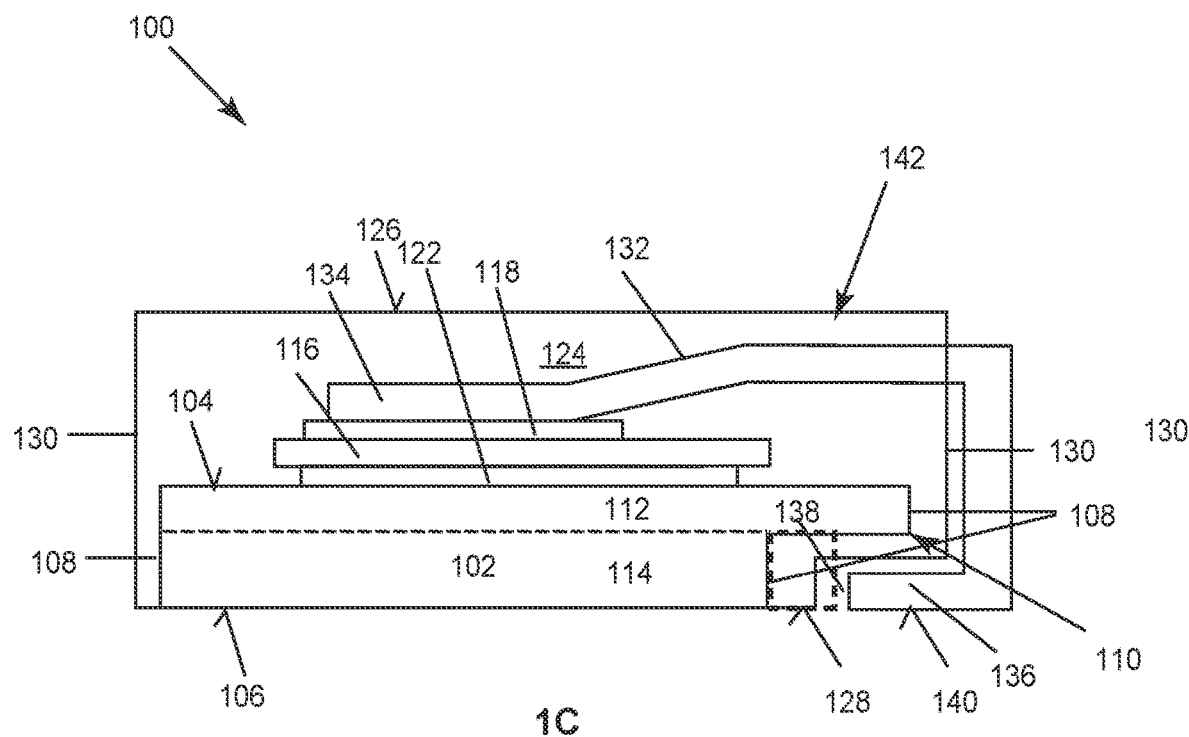
Figure 1:
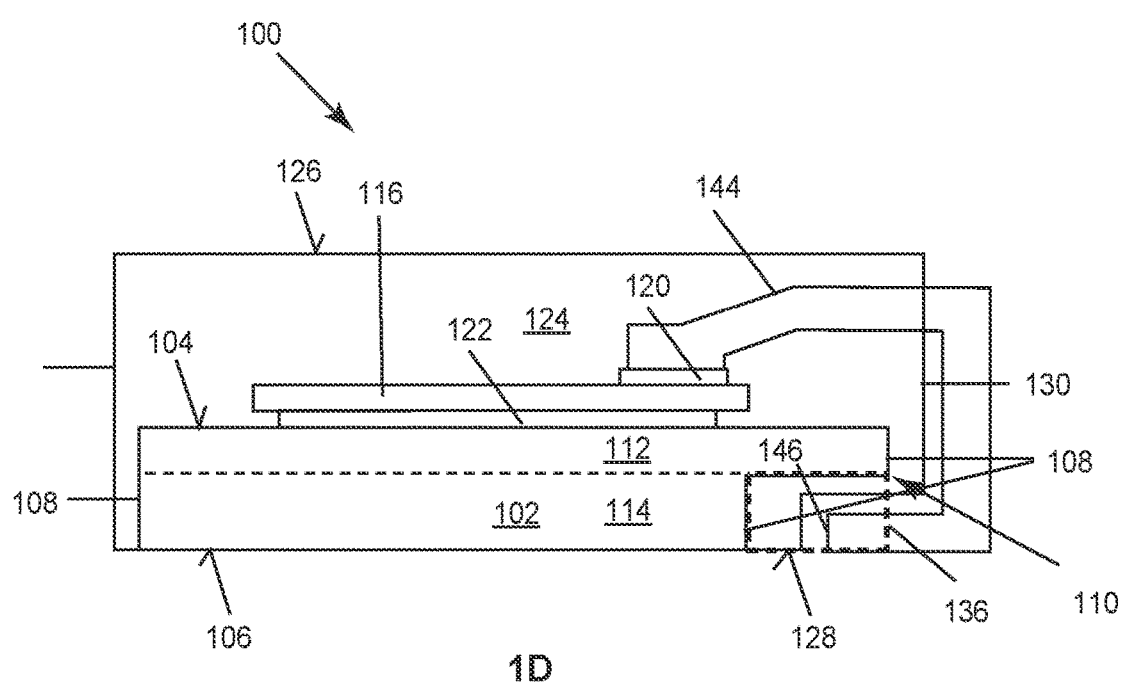

Referring to FIG. 1, a semiconductor package 100 is depicted, according to an embodiment. The semiconductor package 100 includes a die pad 102. The die pad 102 includes a die attach surface 104, a rear surface 106 opposite the die attach surface 104, and outer edge sides 108 extending between the die attach surface 104 and the rear surface 106. The die attach surface 104 and/or the rear surface 106 may be substantially planar surfaces. Moreover, these surfaces may be substantially parallel to one another. The die pad 102 may be a thermally and electrically conductive structure. Exemplary materials for the die pad 102 include metals such as copper, aluminum, nickel, iron, zinc, etc., and alloys thereof.

According to an embodiment, an outer edge side 108 of the die pad 102 has a step-shaped profile 110 wherein an upper section 112 of the die pad 102 laterally overhangs past a lower section 114 of the die pad 102. As a result, the die pad 102 includes a groove extending from the rear surface 106 at the outer edge side 108. This configuration may be referred to as a "dual-gauge" configuration, wherein the upper section 112 of the die pad 102 has a greater thickness than the lower section 114. This configuration can be obtained using a so-called half-etch technique. According to this technique, the die pad 102 is formed from a substantially uniform thickness portion of conductive material, e.g., a sheet of metal. This uniform thickness portion is masked and etched about halfway through on both sides. As a result, the regions exposed from the mask on both sides are completely removed and the regions only exposed on one side are partially removed, i.e., "half-etched." The groove extending from the rear surface 106 at the outer edge side may be a half-etched feature. More generally, a variety of techniques such as stamping, etching, punching, etc. may be used to obtain the step-shaped profile 110.

A semiconductor die 116 is mounted on the die attach surface 104 of the die pad 102. Generally speaking, the semiconductor die 116 can have a wide variety of device configurations, such as a MOSFET (Metal Oxide Semiconductor Field Effect Transistor), an IGBT (Insulated Gate Bipolar Transistor), a JFET (Junction Field Effect Transistor), a diode, etc. The semiconductor die 116 may include any of a wide variety of semiconductor materials including type IV semiconductors, e.g., silicon (Si), silicon germanium (SiGe), silicon carbide (SiC), etc., and type III-V semiconductors. e.g., gallium nitride (GaN), gallium arsenide (GaAs), etc. The semiconductor die 116 may be configured as a vertical device that is configured to control a current flowing between opposite facing upper and lower surfaces, or a lateral device that is configured to control a current flowing parallel to a main surface.

In the depicted embodiment, the semiconductor die 116 includes first, second and third electrical terminals 118, 120, 122. The first and second electrical terminals 118, 120 are disposed on an upper surface of the semiconductor die 116 that faces away from the die attach surface 104. The third electrical terminal 122 is disposed on a lower surface of the semiconductor die 116 that faces the die attach surface 104. The third electrical terminal 122 may be directly electrically connected to the die attach surface 104 such that the die pad 102 acts as an external terminal for the semiconductor package 100. A conductive intermediary, e.g., sinter, solder, etc. (not shown in FIG. 1) may be provided between the two surfaces to effectuate this connection.

According to an embodiment, the semiconductor die 116 is configured as a MOSFET, wherein the first electrical terminal 118 is a source pad, the second electrical terminal 120 is a gate pad, and the third electrical terminal 122 is a drain paid. According to another embodiment, the semiconductor is configured as an IGBT, wherein the first electrical terminal 118 is a collector pad, the second electrical terminal 120 is a gate pad, and the third electrical terminal 122 is an emitter pad. According to another embodiment, the semiconductor is configured as a diode, wherein the first electrical terminal 118 is an anode, the second electrical terminal 120 is a cathode, and the third electrical terminal 122 is omitted. More generally, the semiconductor die 116 can include a wide variety of device configurations with electrical terminals disposed on one or both sides of the semiconductor die.

The semiconductor package 100 includes an encapsulant 124. The encapsulant 124 includes a top surface 126 extending over the semiconductor die 116, a bottom surface 128 opposite the top surface 126, and outer edge surfaces 130 extending between the top and bottom surfaces 126, 128.

The encapsulant 124 includes electrically insulating materials, e.g., ceramics, epoxy materials, thermosetting plastics, thermoplastics, etc. The encapsulant 124 can be formed according to a variety of techniques, e.g., injection molding, compression molding, transfer molding, etc. The encapsulant 124 is formed to encapsulate (i.e., surround and enclose) the semiconductor die 116 and associated electrical connections with the electrical terminals of the semiconductor die 116.

The semiconductor package 100 includes a first conductive clip 132. The first conductive clip 132 is an electrically conductive and (optionally) thermally conductive structure. The first conductive clip 132 be formed from conductive metals such as copper, aluminum, nickel, gold, silver, etc., and alloys thereof. The first conductive clip 132 can be a monolithically formed feature. For example, the first conductive clip 132 can be provided from a single sheet of planar metal that is processed, e.g., by stamping, etching, bending, etc., to form the features disclosed herein. Alternatively, the first conductive clip 132 can be formed by connecting multiple discrete conductive structures together using known techniques, e.g., soldering, welding, riveting, etc. In an embodiment, the first conductive clip 132 is separately provided from a lead frame structure that provides the die pad 102 and any of the leads for the semiconductor package 100, and has different material properties, e.g., thickness, material composition, etc., as the lead frame structure.

The first conductive clip 132 is electrically connected to the first electrical terminal 118. To this end, the first conductive clip 132 includes a central pad 134 that directly electrically contacts the first electrical terminal 118. The central pad 134 is disposed directly over the first electrical terminal 118 and contained within the outer edge surfaces 130 of the encapsulant 124. As shown, a portion of the central pad 134 is directly over the first electrical terminal 118 and a portion laterally overhangs past the first electrical terminal. Optionally, the central pad 134 may laterally overhang past the semiconductor die 116 in every direction, with a central portion of the central pad 138 being disposed directly over the first electrical terminal 118. The electrical connection between the central pad 134 and the first electrical terminal 118 may be effectuated by direct surface-to-surface contact or by a conductive intermediary, e.g., solder, sinter, adhesive tape, etc.

The first conductive clip 132 includes a portion that wraps around the outer edge side 108 of the die pad 102. This means that a portion of the first conductive clip 132 laterally extends past an outermost lateral side of the die pad 102 (the outer edge side 108 in the upper section 112 in the depicted examples) from above the die attach surface 104, then vertically extends downward past the die attach surface 104, and then laterally extends past the outermost lateral side of the die pad 102 again. As a result, the first conductive clip 132 includes a section that is disposed directly above the die attach surface 104 and a section that is disposed directly below the die attach surface 104.

According to an embodiment, the first conductive clip 132 wraps around the outer edge side 108 of the die pad 102 such that a section of the first conductive clip 132 is at least partially within an area 136 that is directly below the upper section 112 of the die pad 102 and directly laterally adjacent to the lower section 102 of the die pad 102. This means that the first conductive clip 132 enters an area 136 that is vertically between the upper section 112 of the die pad 102 and a plane that is parallel to the rear surface 106 and is laterally between the outer edge side 108 in the lower section 114 of the die pad 102 and a plane that is tangent to the outer edge side 108 in the upper section 112. Put another way, the first conductive clip 132 enters the groove formed in the rear surface 106 of the die pad 102. The first conductive clip 132 is "at least partially within" the area 136, within the meaning of this disclosure, if any portion of the first conductive clip 132 crosses the boundaries of the 136 described above. According to the depicted embodiment, the first conductive clip 132 is configured such that a lateral segment extending to an outer end 138 of the first conductive clip 132 is completely within this area 136. Hence, the outer end 138 of the first conductive clip 132 is completely within the groove in the rear surface 106 of the die pad 102.

The first conductive clip 132 includes a contact surface 140 that is exposed from the encapsulant 124 and provides an external point of electrical contact to the first electrical terminal 118. This contact surface 140 may a lowermost surface of the first conductive clip 132, i.e., a surface of the first conductive clip 132 that is below and vertically furthest away from the die attach surface 104. According to an embodiment, the contact surface 140 is a substantially planar surface that laterally extends form an angled bend in the first conductive clip 132 to the outer end 138 of the first conductive clip 132. According to an embodiment, the contact surface 140 is disposed at or above closer to the die attach surface 104) a plane of the bottom surface 128 of the encapsulant 124. According to the depicted embodiment, the contact surface 140 of the first conductive clip 132, the rear surface 106 of the die pad 102, and the bottom surface 128 of the encapsulant 124 are each coplanar with one another. Hence, the semiconductor package 100 can be mounted on a planar receptacle with the die pad 102 and the first conductive clip 132 providing surface mount connectivity. In other embodiments, the die pad 102 and/or the lowermost surface of the first conductive clip 132 may be vertically offset from the bottom surface 128 of the encapsulant 124.

According to an embodiment, the first conductive clip 132 includes an elongated finger 142 that connects with the central pad 134 and protrudes out of the encapsulant 124. This elongated finger 142 wraps around the outer edge side 108 of the die pad 102 in the above described manner. The elongated finger 142 is narrower than the central pad 134, wherein the width of these elements is measured between opposite facing outer edge sides.

In the depicted embodiment, the elongated finger 142 has an acute angled configuration with a vertical portion that is substantially parallel to the outer edge surface 130 of the encapsulant 124 and substantially orthogonal angled bends connecting the vertical portion to lateral portions that extend past the outer edge side 108 of the die pad 102. More generally, the first conductive clip 132 may include curves and/or one or more oblique angles to achieve the wrap around configuration as described herein.

According to an embodiment, the first conductive clip 132 includes a plurality (i.e., two or more) of elongated fingers 142. Each of these elongated fingers 142 may connect to same side of the central pad 134 at different locations and have an identical wrap around configuration as described above. These elongated fingers 142 may be spaced apart from one another, e.g., by a regular separation distance. While the depicted first conductive clip 132 includes four of the elongated fingers 142, each having substantially uniform width and regular spacing, the number, size, spacing, etc. of the elongated fingers 142 may be adapted to meet a variety of design considerations such as package size, current carrying capability, etc.

As shown in the depicted embodiment, the encapsulant 124 is formed such that the portion of the first conductive clip 132 extending to the outer end 138 is spaced apart from the encapsulant 124. In another embodiment, the encapsulant 124 completely extends completely to cover at least an upper surface of the first conductive clip 132 this corner portion of the semiconductor package 100.

According to an embodiment, the first conductive clip 132 is initially provided as a planar strip of conductive metal. This planar strip can be structured to include the shape of the central pad 134 and a planar elongated strip extending away from the central pad 134. This planar strip is mounted to electrically contact the first conductive terminal 118 prior to encapsulation. The encapsulant 124 can then be formed, e.g., in the manner described above. After encapsulation, an exposed portion of the planar strip protrudes out of the encapsulant 124. This exposed portion is then formed to wrap around the outer edge side of the die pad 102, e.g., as described above with respect to the first conductive finger 142. This may be done by bending the exposed metal.

According to an embodiment, the semiconductor package 100 includes a second conductive clip 144, e.g., as shown in FIG. 1D. The second conductive clip 144 directly electrically contacts the second electrical terminal 120 and wraps around the outer edge side 108 of the die pad 102 such that an outer end 146 of the second conductive clip 144 is at least partially within the area 136 that is directly below the upper section 112 of the die pad 102 and directly laterally adjacent to the lower section 114 of the die pad 102. Hence, the second conductive clip 144 is correspondingly configured to provide a point of electrical contact to the second electrical terminal 116 in a similar manner as previously described. In the depicted embodiment, the second conductive clip 144 has a uniform width from end to end that is substantially identical to the width of one of the elongated fingers 142 of the first conductive clip 132. This width may be suitable for carrying lower current signals, e.g., a gate signal in the case of a MOSFET. More generally, the geometry of the second conductive clip 144 can include multiple elongated fingers according to any variation of the first conductive clip 132 described above, and the first and second conductive clips 132, 144 can be tailored collectively to provide appropriate current carrying capability.

Figure 2:
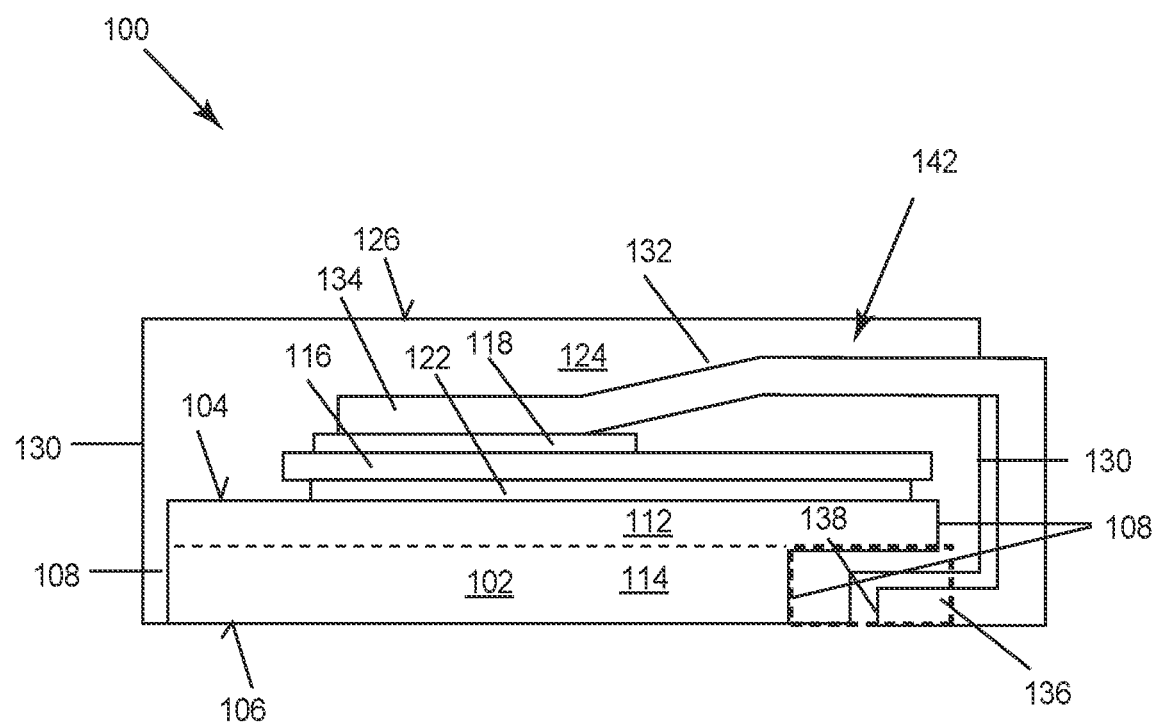
FIG. 2 illustrates a cross-sectional view of a semiconductor package, according to another embodiment, along a cross-sectional plane corresponding to the cross-sectional plane A-A' shown in FIG. 1A.

Referring to FIG. 2, a semiconductor package 100 is depicted, according to another embodiment. The semiconductor package 100 of FIG. 2 is identical to the semiconductor package 100 of FIG. 1, except in the following ways. In this embodiment, the semiconductor die 116 is mounted on the die pad 102 such that the semiconductor die 116 laterally overhangs past the lower section of the die pad 102. Put another way, the semiconductor die 116 is laterally disposed close enough to the outer edge side 108 of the die pad 102 such that the semiconductor die 116 is directly above the groove in the rear surface 106. Moreover, the outer end 138 of the first conductive clip 132 is disposed directly below the semiconductor die 116. This configuration enables a high package size to chip ratio, as the semiconductor die 116 laterally extends very close to the outer surface 130 of the encapsulant 124. Meanwhile, due to the step-shaped outer edge side 108 of the die pad 102, the contact surface 140 of the first conductive clip 132 is sufficiently large for reliable and low-resistance electrical connection.

Figure 3:
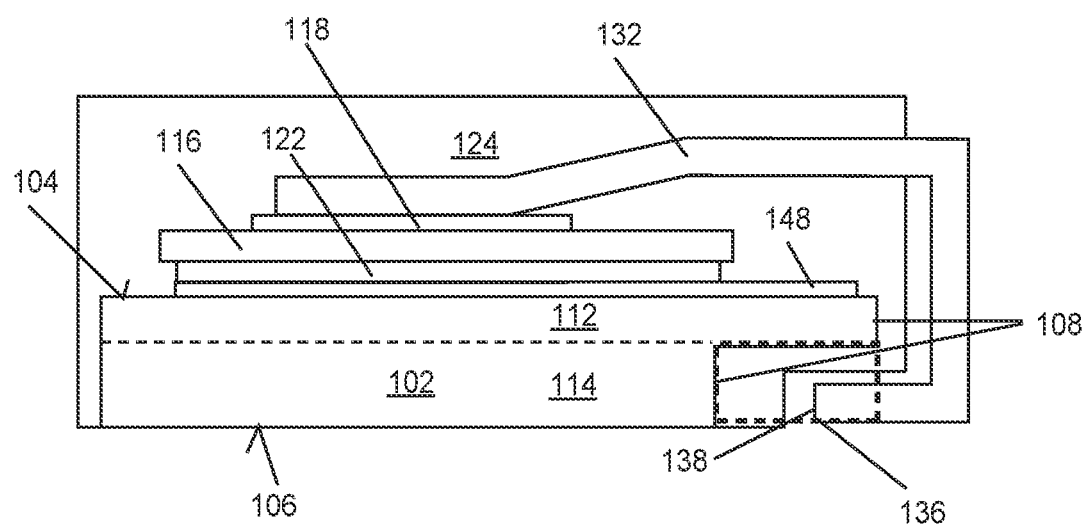
FIG. 3 illustrates a cross-sectional view of a semiconductor package, according to another embodiment, along a cross-sectional plane corresponding to the cross-sectional plane A-A' shown in FIG. 1A.

Referring to FIG. 3, a semiconductor package 100 is depicted, according to another embodiment. The semiconductor package 100 of FIG. 3 is identical to the semiconductor package 100 of FIG. 1, except in the following ways. In this embodiment, the semiconductor package 100 includes an intermediary layer 148 disposed between the rear surface 106 of the semiconductor die 116 and the die attach surface 104 of the die pad 102. The intermediary layer 148 laterally overhangs past the lower section 114 of the die pad 102. Put another way, the intermediary layer 148 is laterally disposed close enough to the outer edge side 108 of the die pad 102 such that the semiconductor die 116 is directly above the groove in the rear surface 106. In this embodiment, the outer end 138 of the first conductive clip 132 is disposed directly below the intermediary layer 148.

According to an embodiment, the intermediary layer 148 is an electrically conductive layer that provides a conductive connection between the third electrical terminal 122 and the die attach surface 104. To this end, the intermediary layer 148 may include one or more of: sinter, solder, conductive tapes (e.g., die attach film), metal plates (e.g., DCB copper plates), etc. Alternatively, the intermediary layer 148 may include electrically insulating materials, e.g., ceramic, dielectrics, tapes, etc.

Figure 4:
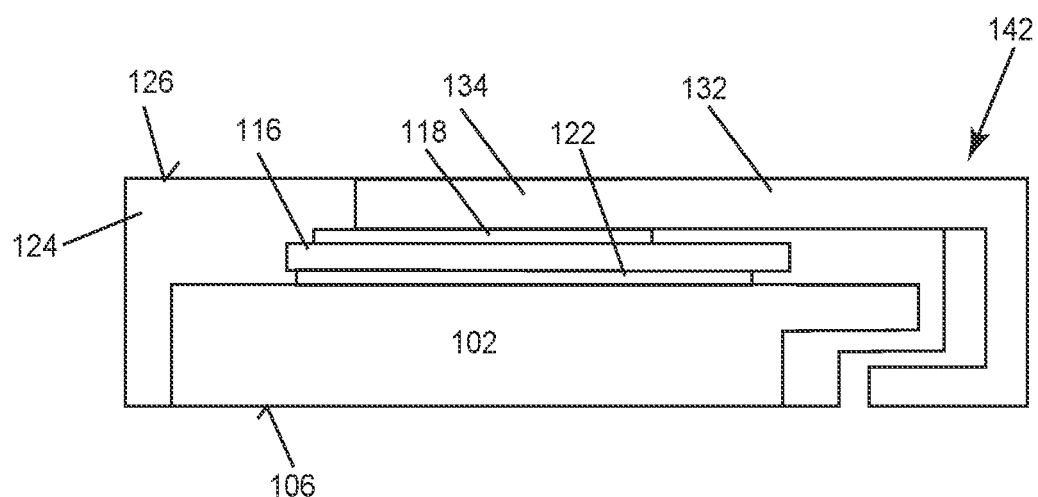
FIG. 4 illustrates a cross-sectional view of a semiconductor package, according to another embodiment, along a cross-sectional plane corresponding to the cross-sectional plane A-A' shown in FIG. 1A.

Referring to FIG. 4, a semiconductor package 100 is depicted, according to another embodiment. The semiconductor package 100 of FIG. 4 is identical to the semiconductor package 100 of FIG. 1, except in the following ways. In this embodiment, the first conductive clip 132 is exposed at the top surface 126 of the encapsulant 124. More particularly, a portion of the first conductive clip 132 that includes the central pad 134 and an upper portion of the elongated finger 142 is exposed at the top surface 126. This portion of the first conductive clip 132 includes an uppermost surface of the first conductive clip 132, i.e., a surface of the first conductive clip 132 that is above and vertically furthest away from the die attach surface 104. According to an embodiment, the uppermost surface of the first conductive clip 132 is substantially coplanar with the top surface 126 of the encapsulant 124.

This configuration of FIG. 4 may be desirable for enhanced heat dissipation capability, particularly if the first electrical terminal 118 generates a significant amount of heat during operation. The exposed upper surface of the first conductive clip 132 may interface with an external heat sink to efficiently remove heat from the device.

Figure 5:
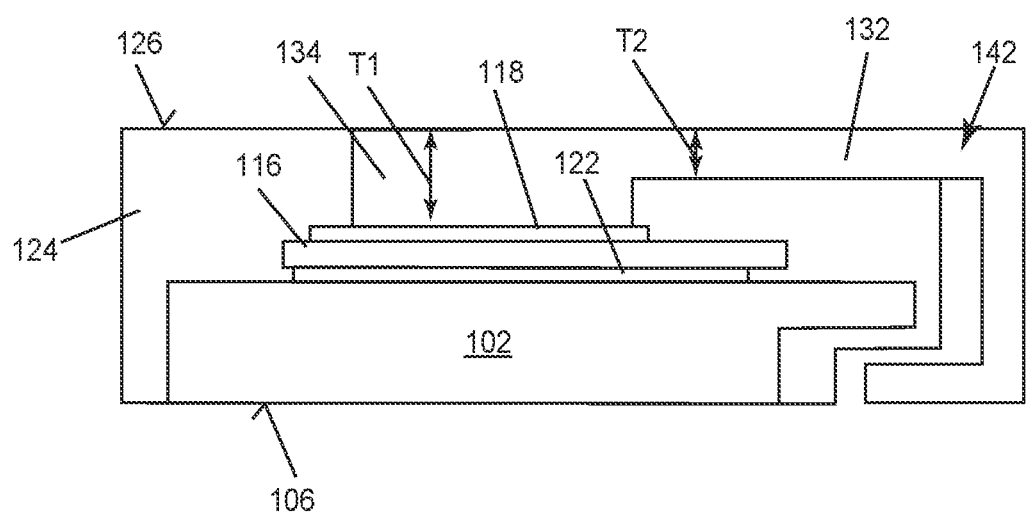
FIG. 5 illustrates a cross-sectional view of a semiconductor package, according to another embodiment, along a cross-sectional plane corresponding to the cross-sectional plane A-A' shown in FIG. 1A.

Referring to FIG. 5, a semiconductor package 100 is depicted, according to another embodiment. The semiconductor package 100 of FIG. 5 is identical to the semiconductor package 100 of FIG. 1, except in the following ways. In this embodiment, the first conductive clip 132 is exposed at the top surface 126 of the encapsulant 124. However, different from the previously discussed embodiment of FIG. 4, the embodiment of FIG. 5 includes a first conductive clip 132 with regions of different thicknesses. More particularly, a thickness T1 of the central pad 134 is greater than a thickness T2 of the elongated finger 142. The thickness of the central pad 134 is measured between the upper surface of the central pad 134 and a lower surface of the central pad 134 that faces the first electrical terminal 118. The thickness of the elongated finger 142 is measured between opposite facing upper and lower surfaces of the elongated finger 142 that connect with the central pad 134. In one example, thickness T1 of the central pad 134 is about twice the thickness T2 of the elongated finger 142.

Figure 6:
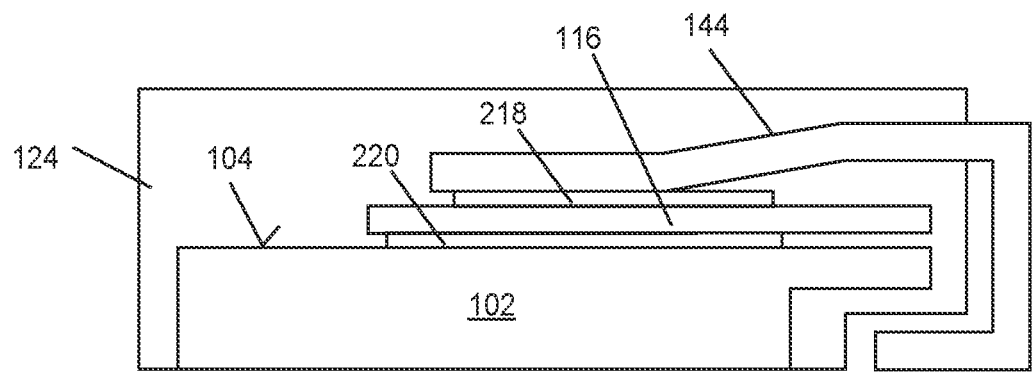
FIG. 6, which includes
Figure 6:
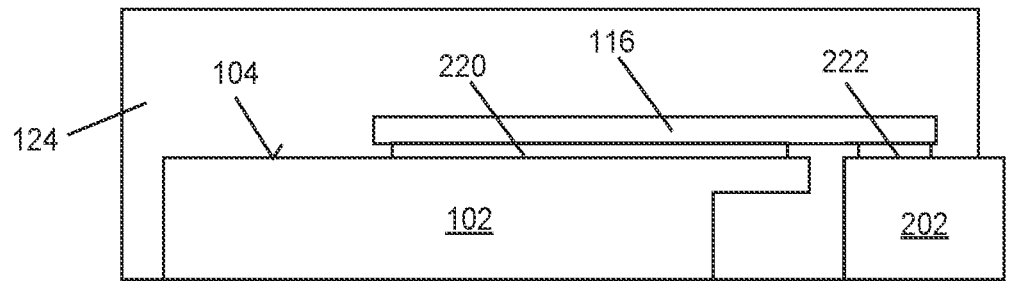

The configuration of FIG. 5 may be desirable for enhanced heat dissipation capability in comparison to the embodiment of FIG. 4, as the larger sized central pad 134 provides efficient heat transfer. Moreover, this embodiment more easily allows for a configuration wherein the second conductive clip 144 is insulated from the top surface 126 of the encapsulant 124. For example, in this embodiment, the second conductive clip 144 can have a single gauge configuration and be disposed below the top side 136 of the encapsulant 126. As a result, one terminal is electrically accessible at the top side 136 of the encapsulant 126, whereas another terminal is not. Referring to FIG. 6, a semiconductor package 100 is depicted, according to another embodiment. The semiconductor package 100 of FIG. 6 is identical to the semiconductor package 100 of FIG. 1, except in the following ways. In this embodiment, the semiconductor die 102 has a so-called flip-chip configuration. According to this configuration, the semiconductor die 116 is mounted on a carrier with multiple I/O terminals directly facing and electrically connected to the carrier. In the depicted embodiment, the semiconductor die 102 is arranged with only a first electrical terminal 218 disposed on the upper surface of the semiconductor die 102 that faces away from the die pad 102, and with second and third electrical terminals 220, 222 disposed on a lower surface of the semiconductor die 102 that faces the die pad 102. In this embodiment, the first conductive clip 132 is directly electrically connected to the first electrical terminal 218 and wraps around the die pad 102 in a similar manner as previously described. Likewise, the die pad 102 is directly electrically connected to the second electrical terminal 220 in a similar manner as previously described. The semiconductor package 100 includes an electrically conductive lead 202 that allows for external electrical access to the third electrical terminal 222. The lead 202 is spaced apart from the die pad 102. As shown, the semiconductor die 116 is mounted such that the second electrical terminal 220 faces and directly electrically contacts the die attach surface 104 and the third electrical terminal 222 faces and electrically contacts an upper surface of the lead 202. The die pad 102 and the lead 202 can be provided as part of a lead frame structure, e.g., according to known techniques.

Each of the above described embodiments include a dual gauge die pad 102, i.e., a die pad 102 with a step shaped transition at one outer edge side 108, and a first conductive clip 138 that utilizes this feature of the die pad 102 as a receptacle for an end of the first conductive clip 138 in a space saving manner. In another embodiment, the semiconductor package 100 can be configured such that the semiconductor die 116 laterally overhangs past an edge side 108 (which may or may not be step-shaped) of the die pad 102 (e.g., in a similar manner as the upper section 112) and the first conductive clip 138 extends underneath the overhanging portion of the semiconductor die 116. This provides similar space-saving benefits.

The term "substantially" as used herein encompasses absolute conformity with the specified requirement as well as minor deviations from absolute conformity with the requirement due to factors such as manufacturing process variations, assembly, and other factors that may cause a deviation from a target design goal. Provided that the deviation is within process tolerances so as to achieve practical conformity and the components described herein are able to function according to the application requirements, the term "substantially" encompasses any of these deviations.

The term "electrically connected," "directly electrically connected" and the like as used herein describes a permanent low-impedance connection between electrically connected elements, for example a direct contact between the relevant elements or a low-impedance connection via a metal and/or a highly doped semiconductor.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
a die pad comprising a die attach surface, a rear surface opposite the die attach surface, and an outer edge side extending between the die attach surface and the rear surface, the outer edge side having a step-shaped profile wherein an upper section of the die pad laterally overhangs past a lower section of the die pad;
a semiconductor die mounted on the die attach surface and comprising a first electrical terminal on an upper surface of the semiconductor die that faces away from the die attach surface; and
a first conductive clip that directly electrically contacts the first electrical terminal and wraps around the outer edge side of the die pad such that a section of the first conductive clip is at least partially within an area that is directly below the upper section of the die pad and directly laterally adjacent to the lower section.

2. The semiconductor package of claim 1, further comprising:
an electrically insulating encapsulant that encapsulates the semiconductor die,
wherein the encapsulant comprises a top surface extending over the semiconductor die, a bottom surface opposite from the top surface, and
wherein a lowermost surface of the first conductive clip is at or above a plane of the bottom surface of the encapsulant.

3. The semiconductor package of claim 2, wherein the lowermost surface of the first conductive clip is a contact surface that extends between an angled bend in the first conductive clip and the outer end of the first conductive clip, wherein the contact surface and the rear surface of the die pad are substantially coplanar with one another, and wherein the contact surface and the bottom surface of the die pad are exposed from the encapsulant.

4. The semiconductor package of claim 3, wherein the bottom surface of the encapsulant is substantially coplanar with the contact surface and the bottom surface of the die pad.

5. The semiconductor package of claim 2, wherein the semiconductor die is mounted on the die pad such that the semiconductor die laterally overhangs past the lower section of the die pad, and wherein the outer end of the first conductive clip is disposed directly below the semiconductor die.

6. The semiconductor package of claim 2, wherein the semiconductor package comprises an intermediary layer disposed between a rear surface of the semiconductor die and the die attach surface, wherein the intermediary layer laterally overhangs past the lower section of the die pad, and wherein the outer end of the first conductive clip is disposed directly below the intermediary layer.

7. The semiconductor package of claim 2, wherein the semiconductor package further comprises an electrically conductive lead that is spaced apart from the die pad, wherein the semiconductor die further comprises second and third electrical terminals disposed on a lower surface of the semiconductor die that is opposite from the upper surface of the semiconductor die, wherein the second electrical terminal directly electrically contacts the die attach surface, and wherein the third electrical terminal directly electrically contacts an upper surface of the lead.

8. The semiconductor package of claim 2, wherein the semiconductor die further comprises a second electrical terminal disposed at the upper surface of the semiconductor die, and wherein the semiconductor package further comprises a second conductive clip that directly electrically contacts the second electrical terminal and wraps around the outer edge side of the die pad such that an outer end of the second conductive clip is at least partially within the area that is directly below the upper section of the die pad and directly laterally adjacent to the lower section.

9. The semiconductor package of claim 2, wherein the first conductive clip comprises a central pad and an elongated finger, wherein the central pad is disposed directly over the first electrical terminal, wherein the elongated finger is narrower than the central pad, wherein the elongated finger connects with the central pad and protrudes out of the encapsulant, and wherein a portion of the elongated finger that is exposed from the encapsulant wraps around the outer edge side of the die pad and extends to the outer end of the first conductive clip.

10. The semiconductor package of claim 9, wherein the encapsulant completely covers the central pad.

11. The semiconductor package of claim 9, wherein the central pad extends to the top surface of the encapsulant and comprises an upper surface that is exposed from the encapsulant.

12. The semiconductor package of claim 11, wherein a thickness of the central pad is greater than a thickness of the elongated finger, the thickness of the central pad being measured between the upper surface of the central pad and a lower surface of the central pad that faces the first electrical terminal, the thickness of the elongated finger being measured between opposite facing upper and lower surfaces that of the elongated finger that connect with the central pad.

13. The semiconductor package of claim 9, wherein the first conductive clip comprises a plurality of the elongated fingers, wherein each of the elongated fingers are spaced apart from one another and connect to same side of the central pad.

14. A method of packaging a semiconductor device, comprising:
providing a die pad comprising a die attach surface, a rear surface opposite the die attach surface, and an outer edge side extending between the die attach surface and the rear surface, the outer edge side having a step-shaped profile wherein an upper section of the die pad laterally overhangs past a lower section of the die pad;

mounting a semiconductor die on the die attach surface such that a first electrical terminal on an upper surface of the semiconductor die faces away from the die attach surface; and providing a first conductive clip that directly electrically contacts the first electrical terminal and wraps around the outer edge side of the die pad such that an outer end of the first conductive clip is at least partially within an area that is directly below the upper section of the die pad and directly laterally adjacent to the lower section.

15. The method of claim 14, further comprising:

forming an electrically insulating encapsulant that encapsulates the semiconductor die, wherein the encapsulant is formed to comprise a top surface extending over the semiconductor die, a bottom surface opposite from the top surface, and wherein a lowermost surface of the first conductive clip is at or above a plane of the bottom surface of the encapsulant.

16. The method of claim 15, wherein providing the first conductive clip comprises:

providing a planar strip of conductive metal that electrically contacts the first terminal;

forming the encapsulant after providing the planar strip of conductive metal such that an exposed portion of the planar strip protrudes out of the encapsulant; and bending the exposed portion of the planar strip such that the exposed portion wraps around the outer edge side of the die pad such that an outer end of the first conductive clip is at least partially within the area that is directly below the upper section of the die pad and directly laterally adjacent to the lower section.

* * * * *